United States Patent [19]

Okamoto et al.

[11] Patent Number: 5,316,585
[45] Date of Patent: May 31, 1994

[54] METHOD FOR FABRICATING SUPERCONDUCTING MATERIALS AND SUPERCONDUCTIVE THIN FILMS

[75] Inventors: Yukio Okamoto, Sagamihara; Toshiyuki Aida, Chofu; Katsuki Miyauchi, Hino; Kazumasa Takagi, Tokyo; Tokuumi Fukazawa, Tachikawa; Shinji Takayama, Mitaka, all of Japan

[73] Assignee: Hitachi, Ltd., Tokyo, Japan

[21] Appl. No.: 560,844

[22] Filed: Jul. 24, 1990

Related U.S. Application Data

[62] Division of Ser. No. 288,750, Aug. 5, 1988, Pat. No. 4,950,642.

[30] Foreign Application Priority Data

Aug. 7, 1987 [JP] Japan ................................ 62-196186
Oct. 7, 1987 [JP] Japan ................................ 62-251497

[51] Int. Cl.$^5$ .............................................. C23C 14/00
[52] U.S. Cl. .............................. 118/719; 118/723 VE; 118/726; 505/732; 505/950; 505/475
[58] Field of Search ........ 118/719, 723, 726, 723 VE; 505/1, 732

[56] References Cited

U.S. PATENT DOCUMENTS

| | | | |
|---|---|---|---|
| 4,268,711 | 5/1981 | Gurev | 427/38 |
| 4,336,277 | 6/1982 | Bunshah | 427/50 |
| 4,361,114 | 11/1982 | Gurev | 427/39 |
| 4,483,725 | 11/1984 | Chang | 437/173 |
| 4,514,437 | 4/1985 | Nath | 427/39 |
| 4,793,908 | 12/1988 | Scott | 204/192.11 |
| 4,888,202 | 12/1989 | Murakami | 427/42 |
| 4,925,829 | 5/1990 | Fujita | 427/42 |

FOREIGN PATENT DOCUMENTS 0292382 11/1988 European Pat. Off. .
8900343 1/1989 PCT Int'l Appl. .

OTHER PUBLICATIONS

Silver et al., Appl. Phys Lett. 52(25), 20 Jun. 1988 2174–2176.
Ishikawa, Rev. Sci. Instrum. 55, p. 449 (1984).
Takaoka, Proc. 11th Symp. on ISIAT, Tokyo (1987).
Bunshah et al., "Deposition Technologies for Films and Coatings", Chapter 4, pp. 83–127, Noyes Publication, 1982.
Chi et al., "Superconducting A-15 Nb$_3$Ge Films Produced by Reactive Evaporation", Thin Solid Films, 72 (1980) pp. 285–290.
Liabowitz et al, "Thin Superconducting Oxide Films", Phys. Rev. B. vol. 35, No. 16 (1987) pp. 8821–8823.
Spah et al "Parameters for in situ Growth of High Tc Superconducting Thin Films Using an Oxygen Plasma Source" Appl. Phys. Lett. 53(5), 00. 441–443 (1988).
Landesman et al "Magnetic and XPS Studies of YBa$_2$Cu$_3$O$_{7-\delta}$ Annealed in O$_2$ Plasmas", AIP No. 165, Nov. 1987 pp. 389–396.
Tamura et al "Effects of Plasma Oxidation of YBa$_2$CuO$_{7-\delta}$ Films" ISEC, 1987 Aug.
Thakoor et al "Insulator Interface Effects in Sputter Deposited NbN/MgO/NbN (Superconductor-Insulator-Superconductor) Tunnel Junctions", J. Vac. Soc. Technol. A5(4) 1987, pp. 1721–1725.
Ono et al "Election Cyclotron Resonance Plasma Deposition Technique Using Raw Material Supply by Sputtering", Jpn. J. Appl. Phys. 23 (1984) 534–L 536.

Primary Examiner—Richard Bueker
Attorney, Agent, or Firm—Antonelli, Terry, Stout & Kraus

[57] ABSTRACT

Chemical reactions of superconducting raw materials with active oxygen atoms and their charged particles are accelerated by using at least oxygen plasma in the fabrication process of a superconductive body. Thereby an ionic crystal is grown in a short time, which provides stable superconducting materials of high quality such as high critical temperature and low resistivity. In another aspect, a substrate is irradiated simultaneously with streams of vapor of metal elements, of which a superconductive body is to be composed, and a stream of gas of ions generated in a plasma chamber and film growth is effected while keeping the substrate at a temperature higher than 400° C. to produce a ceramic type superconductive thin film.

15 Claims, 4 Drawing Sheets

SUPERCONDUCTING RAW MATERIAL 10
Y2O3
BaCO3
CuO

O2 OR O2 MIXED GAS

PUMPING DEVICE

AIR OR OXYGEN

METHOD FOR FABRICATING SUPERCONDUCTING MATERIALS AND SUPERCONDUCTIVE THIN FILMS

This is a division of U.S. application Ser. No. 07/288,750, filed Aug. 5, 1988 now U.S. Pat. No. 4,950,642.

BACKGROUND OF THE INVENTION

The present invention relates to a method for fabricating superconductive bodies, and in particular to a method for fabricating high temperature oxide superconducting materials.

A superconducting material $(La, Ba)_2CuO_4$ having a $K_2NiF_4$ type structure, which Bednorz and Muller have discovered in 1986, has shown a critical temperature as high as 30K. In 1987, it has been found that $YBa_2Cu_3O_{7-x}$ having a perovskite type structure has a still higher critical temperature $T_c=90K$ and it has shown the superconductive state even at the liquid nitrogen temperature.

By a prior art fabrication method, as disclosed in Japanese Journal of Applied Physics, Vol. 26, No. 5 (1987) pp. L676-L677, e.g. in the case of the Y-Ba-Cu-O oxide superconductive body, powders of $Y_2O_3$, $BaCO_3$ and $CuO$ were mixed at a suitable ratio and calcited in the atmosphere or in a oxygen gas medium at a temperature of 950° C. for one hour. Thereafter, it was shaped in a suitable form such as pellets, etc. and sintered in the atmosphere or in an oxygen at a temperature of 900° C. for about 18-19 hours by means of an electric furnace 9, as indicated in FIG. 2, in which a reference numeral 1 represents a high temperature superconductive body obtained by sintering a pellet made of the superconducting material 10 having the composition described above and 2 indicates a substrate.

The prior art technique stated above had problems that fabrication took a long time, that no attention was paid to mixing of impurities, etc., that productivity and stability were unsatisfactory, etc.

The present invention relates to superconducting materials used for high output magnets, Josephson devices, SQUID, etc. and in particular also to a method for fabricating oxide superconductive thin films working at temperatures higher than the boiling point of liquid nitrogen.

A representative method for fabricating superconductive thin film is published in Japanese J. of Appl. Phys., Vol. 26, No. 5 (1987) pp. L709-L710.

Since the crystal structure of the thin films fabricated by the prior art techniques is complicated and on the other hand fabrication thereof is inevitable for electronic devices, there was a problem that it was difficult to obtain thin films of high quality.

SUMMARY OF THE INVENTION

A first object of the present invention is to provide a method for fabricating superconducting materials, capable of resolving the problems described above.

The present invention can be achieved by synthesizing superconducting materials by using at least oxygen plasma.

Treatment by the oxygen plasma acts so as to facilitate the growth of ionic crystals owing to active oxygen atoms and charged particles in the oxygen plasma. In this way, e.g. for a superconducting material of Y-Ba-Cu-O, oxygen and copper atoms become easy to be two-dimensionally aligned, the critical temperature rises, critical current density increases, and thus stable characteristics can be obtained.

A second object of the present invention is to provide thin films of high quality working at temperatures higher than the boiling point of liquid nitrogen and having small degradation.

The above object can be achieved, taking $YBa_2Cu_3O_{7-x}$ as an example, by forming a thin film on a 2 3 7-x substrate held at a temperature relatively low, while projecting the oxygen plasma thereon at the same time, in the course of deposition of Y, Ba and Cu on the substrate, directing a stream of vapor thereof, which is controlled in the flow rate, thereto.

One feature of the present invention provides a method for forming ceramic superconducting thin films, in which a stream 13 of vapor of metallic elements constituting a superconductive body e.g. made of a compound such as $YBa_2Cu_3O_{7-x}$, $(La_{1-x}Ba_x)CuO_4$, etc. and a gas stream 8 of ions produced in a plasma chamber are projected or applied simultaneously on a substrate and the film growth is effected by crystallizing them. As a plasma source it is preferable to use a plasma of ions generated in an electron cyclotron resonance microwave plasma generator 7 or an RF-plasma generator 5, 6. Various kinds of ions generated in this plasma source are not accelerated, but reach the surface of the substrate by diffusion and react with the stream of metal vapor. Consequently, the energy of the ions is very low and therefore, the ions give the substance no damage due to the energy of the ions.

In order to obtain a uniform film, it is preferable that each of streams 13 of vapor of plural of metal elements is flow-rate-controlled by means of a film thickness monitor 14. An evaporation chamber 11 is kept at a vacuum, which is higher than that in the reaction chamber 20, in which gas is introduced, a differential pumping mechanism comprised of a vacuum pump 19 and a throttle plate 17, disposed on both the two chambers. In this way the metal source of plural elements is not contaminated by the plasma gas. For this reason the evaporation speed is controlled to be constant and it is possible to fabricate films of high quality.

The superconducting materials according to the present invention mean ceramic superconducting materials in general, such as $(La, Ba)_2CuO_4$ compounds of $K_2NiF_4$ structure having a critical temperature of 40K, $YBa_2Cu_3O_{7-x}$ compounds having a critical temperature of 90K, $ErBa_2Cu_3O_{7-x}$ compounds, $HoBa_2Cu_3O_{7-x}$ compounds, $EuBa_2Cu_3O_{7-x}$ compounds, $Bi_2Sr_2Ca_2Cu_3O_x$ compounds having a critical temperature of 120K, $Tl_2Ba_2Ca_2Cu_3O_x$ compounds, etc.

DESCRIPTION OF THE PREFERRED EMBODIMENTS

Figure 1:
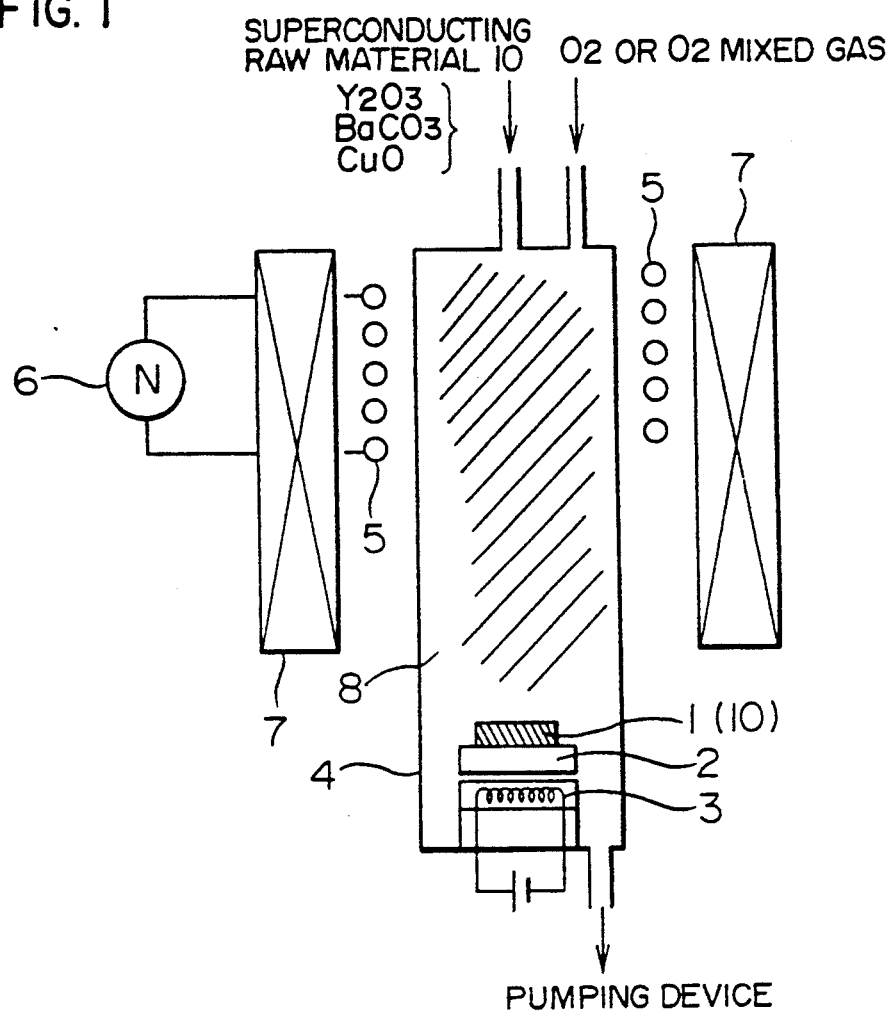
FIG. 1 is a scheme for explaining a method for fabricating superconducting materials according to the present invention, illustrating a device for realizing same.
Figure 2:
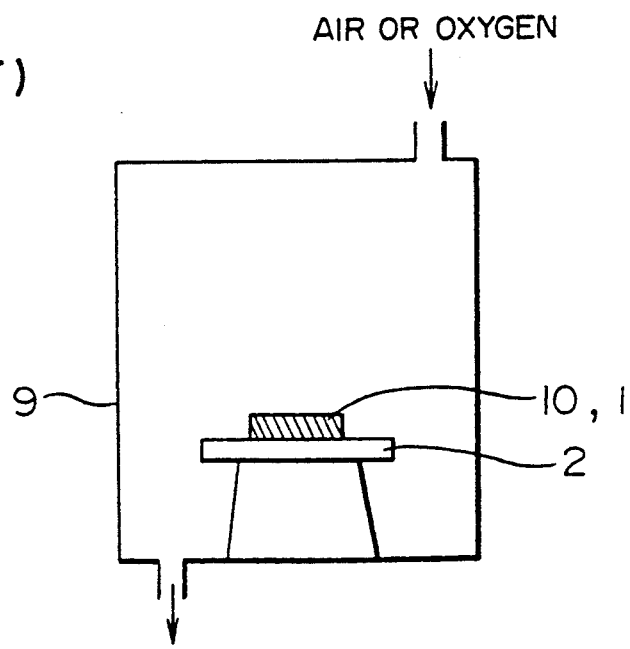
FIG. 2 is a scheme showing a prior art technique.

Hereinbelow an embodiment of the present invention will be explained, referring to the drawings.

Embodiment 1

FIG. 1 is a scheme illustrating an experimental apparatus for realizing the present invention. A vacuum chamber 4 made of glass, etc. can be evacuated to a high vacuum (about $1.3 \times 10^{-6}$ Pa) by means of an evacuating device, within which chamber a superconductive body is formed. Eventually, a substrate 2 on which superconducting materials are set, and a heater 3 for heating them are disposed therein. On the other hand, oxygen plasma is generated while supplying oxygen gas of simple substance or oxygen gas, in which freon gas, argon gas, etc. are mixed, to the vacuum chamber 4 and at the same time feeding a coil 5 disposed outside of the vacuum chamber 4 (capacitive coupling is also possible) with RF power (several 100 W to several 100 MW) from an RF power source 6. In order to facilitate generation of the plasma and confinement thereof, it is preferable to superpose an external magnetic field on the RF magnetic field by means of a field coil 7 (it is also possible not to use this magnetic field). The arrangement of this magnetic field can be any of dispersion type, Miller type, CASP type, etc. Further, in the case where the superconductive body 1 is formed into a thin film, the raw material 10 constituting the superconductive body 1 is powdered and injected into the vacuum chamber 4. On the contrary, in the case where the superconductive body 1 is a pellet, the superconducting material 10 described above is formed into a pellet, which is set on the substrate 2 described above.

Now the working mode of the apparatus stated above and the method for fabricating the semiconductive body will be explained. In the case where the superconductive body 1 is formed into a thin film, the substrate 2 (on which the thin film is formed) is heated by means of the heater 3 (0° to 1000° C.), after having evacuated the vacuum chamber 4 to a high vacuum. Then an active gas such as oxygen, oxygen+freon, etc. is introduced thereinto ($10^{-3}$–$10^7$ Oa) and a plasma having a high temperature (10–$10^4$ eV) and a high density (about $10^{10}$–$10^{16}$/cc) is generated. Then the superconducting raw material, e.g. fine powder of $Y_2O_3$, $BaCO_3$ and CuO (weight ratio$\simeq$0.6:1.5:1.0) is injected into the plasma. At this time active oxygen atoms, those constituting freon, and their charged particles react chemically with atoms constituting the superconducting raw material and are deposited on the substrate 2 so as to grow ionic crystals, forming a superconductive thin film. When a thin film having a predetermined thickness is obtained, the injection of the superconducting row material 10 is stopped. At this time it is desirable to anneal it in the plasma by means of the heater (not longer than several hours at a temperature between 300° and 1500° C.).

Figure 3:
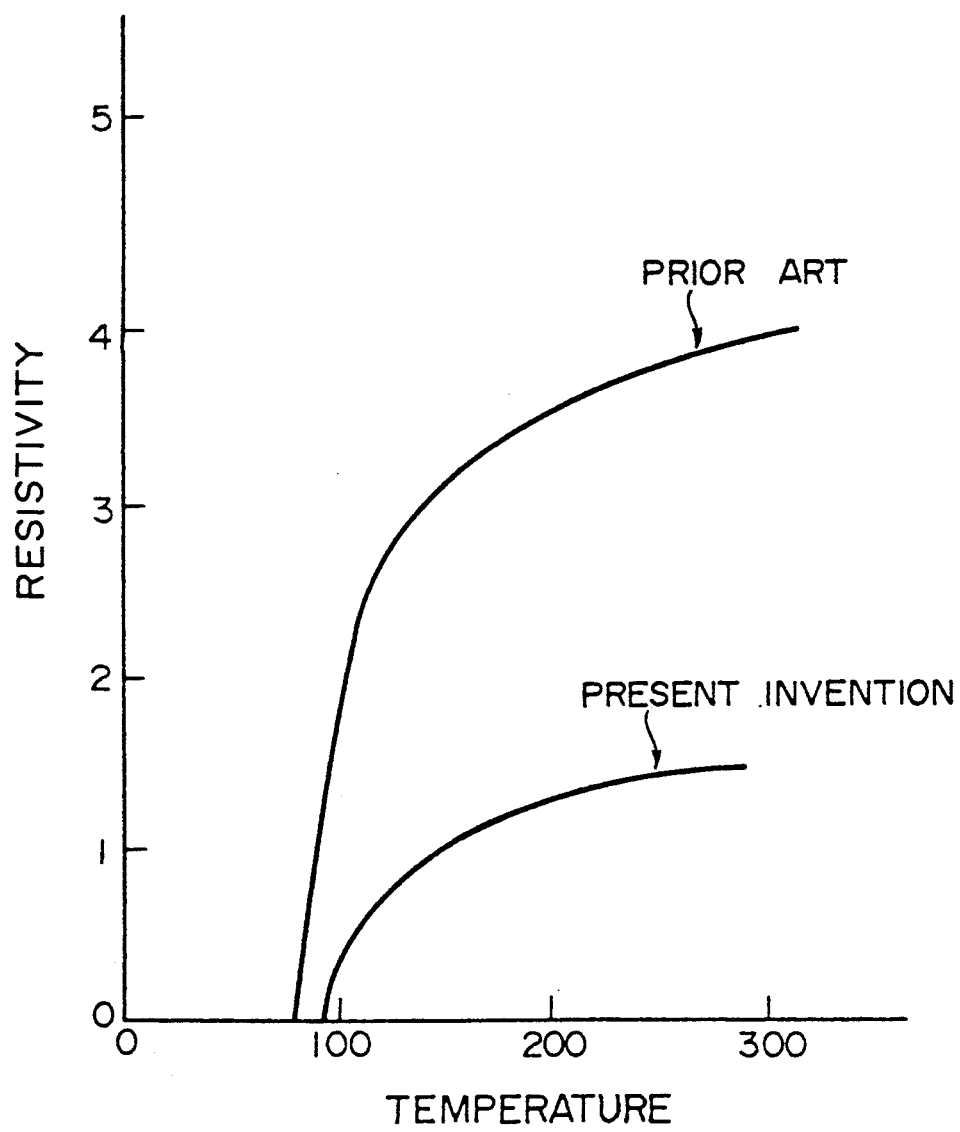
FIG. 3 shows an example of characteristics of a superconducting material obtained by the method according to the present invention.

FIG. 3 indicates the temperature dependence of the resistivity of a high temperature oxide superconductive body Y-Ba-Cu-O fabricated in the manner described above. It can be understood therefrom that the thin film fabricated by the method according to this invention has a higher critical temperature and a lower resistivity with respect to that fabricated by the prior art method using an electric furnace. Further the former has a stability and a critical current density, which are higher than those for the latter.

On the other hand, in the case where the superconductive body 1 is formed into a pellet, for example the superconducting raw material 10 stated previously is set on the substrate 2 after having been formed into a pellet. After the vacuum chamber has been evacuated to a high vacuum and the pellet has been heated (to a temperature, at which it is not sintered), it is sintered in the plasma so as to form the superconductive body 1. Further, the position, where the substrate 2 is set in this case, differs in general from the position for the formation of the thin film described previously (it is set positively in the plasma).

Figure 4A:
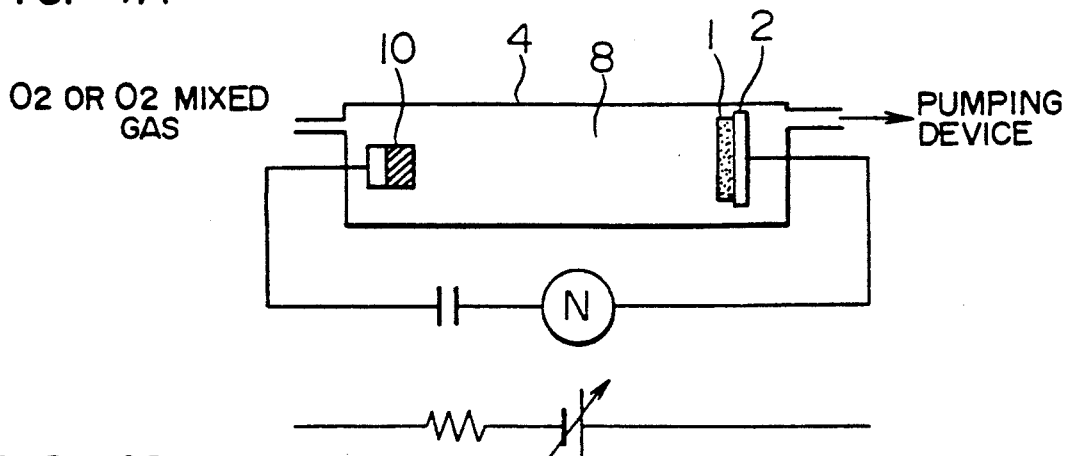
FIGS. 4A, 4B and 4C are schemes showing other embodiments of the present invention.
Figure 4B:
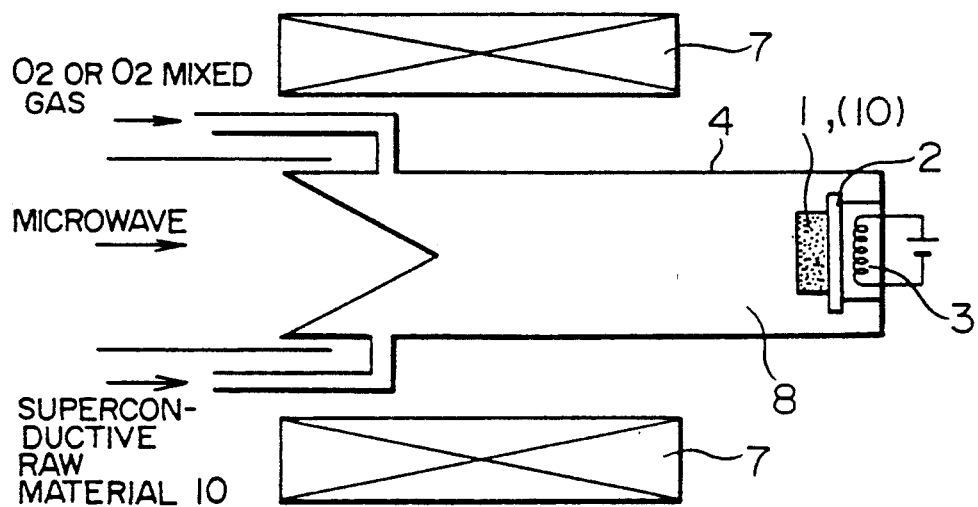
Figure 4C:
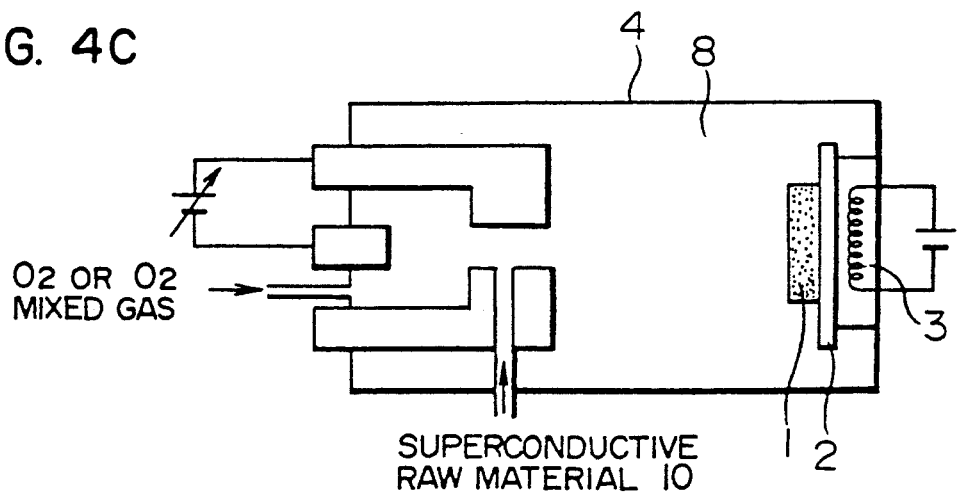

FIGS. 4A, 4B and 4C are schemes illustrating other experimental apparatuses. In the apparatus indicated in FIG. 4A the superconducting raw material 10 acts as the cathode and the desired superconductive body 1 is produced on the anode side. As the power supply an RF, DC or pulse source is used and at least an oxygen plasma is used, as described previously. Further, at this time, the substrate 2 may be heated by means of the heater 3 (omitted in the figure), as stated above.

FIG. 4B is a scheme illustrating an apparatus, in the case where microwave power (frequency higher than 1 GHz, 10 W to $10^2$ kW) is used as the RF power.

FIG. 4C indicates an embodiment, in which arc discharge is used. The embodiments indicated in FIGS. 4A, 4B and 4C are essentially the same as that indicated in FIG. 1. However, since physical quantities (temperature, density, etc.) of the plasma vary, depending on the method for generating the plasma, the working gas pressure and the position of the substrate 2 differ therefrom. In any case at least effectiveness of a plasma at the surface of the superconductive body 1 remain unchanged.

Embodiment 2

According to this invention, since ions produced in the plasma are in an active state, they are easily combined with evaporated metal atoms and thus crystallization of the oxide takes place at a relatively low temperature.

Figure 5:
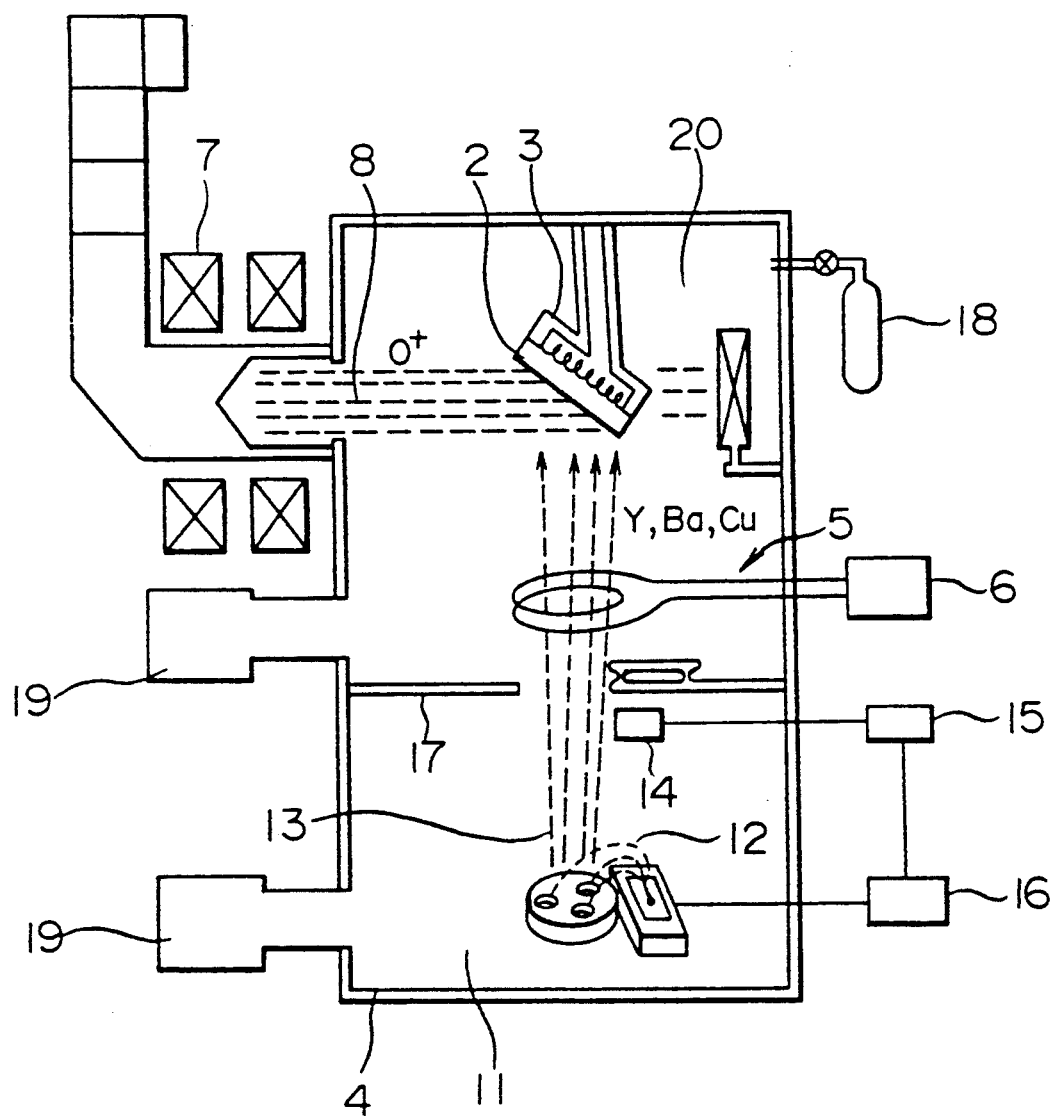
FIG. 5 is a scheme showing an embodiment of the present invention for fabricating thin films.

This effect will be described in detail, referring to an example, in which a thin film of $YBa_2Cu_3O_{7-x}$ is formed. A metal evaporation chamber 11, by which a ternary simultaneous evaporation of Y, Ba and Cu was possible, was disposed in a vacuum chamber 4, whose ultimate vapor pressure was $10^{-4}$ Pa. Streams 13 of vapor of the elements are generated by irradiating the sources thereof one after another with an electron beam 12. The speed of each of the streams of vapor of the elements was inputted in an evaporation speed controller 15 through an electron stimulated light emission photodetector 14 and fed back to a power supply for an electron gun 16 so that it reached a predetermined value and that it didn't vary during the evaporation. In the vacuum chamber there was disposed a differential pumping mechanism consisting of a pump mounted for each of the evaporation chamber 11 and the reaction chamber 20 and a throttle plate 17 separating them apart from an aperture, through which the streams of metal vapor pass. $O_2$ gas was introduced in the reaction chamber from an $O_2$ gas bomb 18 to a pressure of $10^{-2}$ Pa. After that, in the upper chamber a plasma of O ions was generated by means of an electron cyclotron resonance microwave (ECR) plasma generator 7 or an RF wave generator 5, 6. The deposition speed of each of the metal elements of Y, Ba and Cu was obtained by using the relative relation between a thin film deposited previously and a film thickness monitor 14. The evaporation speed was so controlled to be 30 nm/s, and they were separately evaporated so as to obtain a molar ratio thereof of 1:2:3. At the same time the substrate 2 was irradiated with the $O_2$ plasma. The evaporation chamber was kept at a high vacuum of $10^{31.4}$ Pa owing to the differential pumping mechanism. For this reason the melts of Y, Ba and Cu were formed stably and thus it was possible to keep the evaporation speed to be constant. The $O^+$ plasma was generated in the plasma generating portion, as indicated in FIG. 5, and they were not accelerated intentionally, but they reached the surface of the substrate by diffusion. For this reason the ion energy was as low as a value, which was smaller than 10 eV and the ions gave thereof the thin film no damage due to ion impact. For the substrate an Si monocrystal having a crystallographical orientation of (100) was used. The heater 3 mounted on the substrate was fed with electric current so that the temperature of the substrate was varied from the room temperature to 800° C. The thickness of deposited films was kept at 500 nm and the film quality was examined by using an X-ray diffraction device. In this way it was found that it was amorphous for the substrate kept at the room temperature, but a superconductive state of $YBa_2Cu_3O_{7-x}$ was obtained already at a temperature of the substrate of 400° C. No reaction phase was found between the $YBa_2Cu_3O_{7-x}$ film and the Si monocrystal. For the conventional fabrication of superconductive bodies oxide substrates such as MgO, $Al_2O_3$, $SrTiO_3$ and YSZ (Yttria stabilized Zirconia) were used principally. This is due to the fact that the $YBa_2Cu_3O_{7-x}$ film and the Si substrate react with each other, because a temperature higher than 700° C. is necessary for the substrate temperature or annealing after the film formation. The superconductive film formed on the Si substrate according to this invention was a film of high quality, whose critical temperature was 87K, whose critical current density was about $10^5$ A/cm$^2$ and whose characteristics were not deteriorated, even if it was left in the atmosphere for about two months.

The oxygen plasma used in the present invention may be generated in normal and/or pulse form using at least one of RF power (including a microwave) and direct-current power. Alternatively, the oxygen plasma may be generated using an external magnetic field.

The application of this invention is not restricted to the $YBa_2Cu_3O_{7-x}$ superconductive body, but it can be applied as well to other ternary superconductive bodies, e.g. $(La, Ba)_2CuO_4$. Furthermore, if $CF_4$ is also introduced in the plasma generating portion, since F plasma is produced, too, it can be applied to the formation of any ceramic thin film such as fluoride.

According to the present invention, at least oxygen plasma is used in the fabrication process of superconducting material including a thin film, whereby a chemical reaction and/or a physical reaction of a superconducting raw material such as a stream of metal vapor and active oxygen atoms such as radical oxygen atoms and/or charged particles thereof are promoted, so that a single crystal of superconducting material (film) is grown at a low temperature in a short time. Thus, a superconducting material with good characteristics such as high critical temperature and high critical current density and with high stability i.e. long life can be produced. According to the present invention, since the combination of Si devices with superconductive bodies is easy, the economical merit thereof is very great.

What is claimed is:

1. An apparatus for fabricating a superconducting thin film comprising:
   en evaporation chamber for generating a stream of vapor of metal elements;
   plasma generating means for generating an oxygen plasma;
   a reaction chamber for reacting said stream of vapor of the metal elements with said oxygen plasma on a substrate without further heat-treatment; and
   a differential pumping mechanism including a throttle plate separating said evaporation chamber and said reaction chamber from each other and an evacuating pump provided for each chamber and evacuating said evaporation chamber to a higher vacuum than said reaction chamber.

2. An apparatus according to claim 1, wherein said plasma generating means includes an electron cyclotron resonance (ECR) microwave plasma generator.

3. An apparatus according to claim 1, further comprising a heater for raising the temperature of said substrate.

4. An apparatus according to claim 1, further comprising means for controlling the speed of said stream of vapor of said metal elements, said speed control means including a thickness monitor.

5. An apparatus for fabricating a superconducting thin film comprising:
   an evaporation chamber for generating a stream of vapor of metal elements;
   plasma generating means for generating an oxygen plasma; and
   a reaction chamber for reacting said stream of vapor of the metal elements with said oxygen plasma on a substrate without further heat-treatment at a temperature above 700° C.;
   a differential pumping mechanism including a throttle plate separating said evaporation chamber and said reaction chamber from each other and an evacuating pump provided for each chamber and evacuating said evaporation chamber to a higher vacuum than said reaction chamber.

6. An apparatus for fabricating a superconducting thin film comprising:
   plasma generating means for generating an oxygen plasma;
   a vacuum chamber including an evaporation chamber, a reaction chamber and a throttle plate separating the evaporation chamber from the reaction chamber, said evaporation chamber including means for generating a stream of vapor of metal elements, said throttle plate having an aperture through which the stream of vapor of the metal elements passes, and said reaction chamber being coupled to said plasma generating means for reacting in said reaction chamber the stream of vapor of the metal elements with said oxygen plasma;
   a first vacuum pump coupled to said evaporation chamber; and
   a second vacuum pump coupled to said reaction chamber, for evacuating the reaction chamber to a lower vacuum than said evaporation chamber.

7. An apparatus according to claim 6, wherein said plasma generating means includes an electron cyclotron resonance (ECR) microwave generator.

8. An apparatus according to claim 6, further comprising a heater for raising the temperature of said substrate.

9. An apparatus according to claim 6, further comprising speed control means for controlling the speed of said stream of vapor of said metal element, said speed control means including a thickness monitor.

10. An apparatus according to claim 6, wherein said means for generating a stream of vapor of metal elements includes a source of said metal elements, and said metal elements comprise Y, Ba and Cu.

11. An apparatus according to claim 6, wherein said means for generating a stream of vapor of metal elements includes a source of said metal elements, and said metal elements comprise La, Ba and Cu.

12. An apparatus according to claim 6, wherein said first vacuum pump, said second vacuum pump and said throttle plate are arranged to enable said evaporation chamber to be evacuated to a vacuum two orders of magnitude higher than that of said reaction chamber.

13. An apparatus for fabricating a superconducting thin film comprising:
   plasma generating means for generating active oxygen toms;
   a vacuum chamber including an evaporation chamber, a reaction chamber and a throttle plate separating the evaporation chamber from the reaction chamber, said evaporation chamber including means for generating a stream of vapor of metal elements, said throttle plate having an aperture through which the steam of vapor of the metal elements passes, and said reaction chamber being coupled to said plasma generating means for reacting in said reaction chamber the stream of vapor of the metal elements with said active oxygen atoms;
   a first vacuum pump coupled to said evaporation chamber; and
   a second vacuum pump coupled to said reaction chamber, for evacuating the reaction chamber to a lower vacuum than said evaporation chamber.

14. An apparatus for fabricating a superconducting thin film comprising:
   plasma generating means for generating active oxygen atoms;
   a vacuum chamber including an evaporation chamber, a reaction chamber and a throttle plate separating the evaporation chamber from the reaction chamber, said evaporation chamber including means for generating a stream of vapor of metal elements, said throttle plate having an aperture through which the stream of vapor of the metal elements passes, and said reaction chamber being coupled to said plasma generating means for reacting in said reaction chamber the stream of vapor of the metal elements with said active oxygen atoms;
   means for evacuating said evaporation chamber and for evacuating said reaction chamber to a lower vacuum than said evaporation chamber.

15. An apparatus according to claim 14, wherein said generating means comprises an electron cyclotron resonance (ECR) microwave generator for generating an oxygen plasma.

* * * * *